United States Patent
Ambra et al.

(10) Patent No.: US 10,143,103 B2
(45) Date of Patent: Nov. 27, 2018

(54) SYSTEM FOR CONTROLLING INDUSTRIAL AND DOMESTIC DEVICES

(71) Applicant: EXOR INTERNATIONAL S.P.A., San Giovanni Lupatoto (IT)

(72) Inventors: Claudio Ambra, Negrar (IT); Fausto Gastaldin, Verona (IT)

(73) Assignee: EXOR INTERNATIONAL S.P.A., San Giovanni Lupatoto (IT)

( * ) Notice: Subject to any disclaimer, the term of this patent is extended or adjusted under 35 U.S.C. 154(b) by 0 days.

(21) Appl. No.: 14/893,389

(22) PCT Filed: May 28, 2014

(86) PCT No.: PCT/IB2014/061781
§ 371 (c)(1),
(2) Date: Nov. 23, 2015

(87) PCT Pub. No.: WO2014/191933
PCT Pub. Date: Dec. 4, 2014

(65) Prior Publication Data
US 2016/0135319 A1      May 12, 2016

(30) Foreign Application Priority Data

May 28, 2013   (IT) ............................ VR2013A0129

(51) Int. Cl.
*H05K 7/14*   (2006.01)
*G06F 1/16*   (2006.01)
(Continued)

(52) U.S. Cl.
CPC ............ *H05K 7/14* (2013.01); *G06F 1/1601* (2013.01); *H03K 17/962* (2013.01);
(Continued)

(58) Field of Classification Search
CPC ............................... G06F 1/1601; G06F 3/041
(Continued)

(56) References Cited

U.S. PATENT DOCUMENTS 6,399,883 B1 *  6/2002  Lhota ..................... H02G 3/263
                                                        174/101
6,504,713 B1   1/2003  Pandolfi et al.
(Continued)

FOREIGN PATENT DOCUMENTS

EP    2472350 A2   7/2012
GB    2465472 A    5/2010

OTHER PUBLICATIONS

International Search Report dated Oct. 9, 2014 re: Application No. PCT/IB2014/061781; citing: US 2004/104889 A1, GB 2 465 472 A, EP 2 472 350 A2, US 2010/220441 A1, U.S. Pat. No. 6,504,713 B1 and US 2012/080296 A1.

*Primary Examiner* — Mukund G Patel
(74) *Attorney, Agent, or Firm* — Cantor Colburn LLP

(57) ABSTRACT

A system for controlling industrial and domestic devices includes a monitor and a cylindrical body. The monitor comprises a multitouch screen of the capacitive type and a panel that has an interface adapted to receive the cylindrical body. The cylindrical body further includes a cavity that is adapted to contain a data receiving device and is further adapted to be fixed to industrial and domestic devices.

7 Claims, 4 Drawing Sheets

(51) Int. Cl.
*H03K 17/96* (2006.01)
*H05K 5/02* (2006.01)
*H05K 7/20* (2006.01)
*H05K 9/00* (2006.01)

(52) U.S. Cl.
CPC ......... *H05K 5/0217* (2013.01); *H05K 5/0247* (2013.01); *H05K 7/1462* (2013.01); *H05K 7/2039* (2013.01); *H05K 9/0015* (2013.01)

(58) Field of Classification Search
USPC ............. 361/679.01, 679.02; 174/50.2, 50.3, 174/50.5, 59
See application file for complete search history.

(56) References Cited

U.S. PATENT DOCUMENTS

| | | | |
|---|---|---|---|
| 6,975,508 B2 * | 12/2005 | Hoegener | H05K 5/0017 361/679.43 |
| 2004/0104889 A1 | 6/2004 | Fehrenbach et al. | |
| 2007/0081344 A1 * | 4/2007 | Cappaert | G02B 6/0085 362/373 |
| 2009/0275242 A1 * | 11/2009 | Erten | H01R 9/035 439/660 |
| 2010/0170713 A1 * | 7/2010 | Edel | H05K 5/0247 174/520 |
| 2010/0220441 A1 | 9/2010 | Berlekamp | |
| 2011/0085287 A1 * | 4/2011 | Ebrom | G08C 17/02 361/679.01 |
| 2012/0080296 A1 | 4/2012 | Schechtel et al. | |

\* cited by examiner

SYSTEM FOR CONTROLLING INDUSTRIAL AND DOMESTIC DEVICES

CROSS REFERENCE TO RELATED APPLICATION

This application is related to and claims the benefit of Italian Patent Application Serial Number VR2013A000129, filed on May 28, 2013, the contents of which are herein incorporated by reference in their entirety.

TECHNICAL FIELD

The present disclosure relates to the field of human-machine interaction and particularly to an interface for controlling devices used in industrial and domestic contexts.

BACKGROUND

Buttons are one of the simplest mechanisms and for this reason they are widespread for controlling machines or processes. Typically made of rigid material, such as plastics or metal, they often have a surface that is generally flat or contoured to accommodate the finger or the hand, so as to be pushed and released easily. Such buttons, especially if used in the industrial field, must be sturdy, since they withstand great stresses, and must be very reliable, i.e., they must allow constant control of the device on which they are fitted. A typical example of widely used button is the M22 type, known by this name because it has a connector with a circular cross-section that measures 22 mm in diameter. Such type of button is appreciated for being easy to install, because its wide diffusion has rendered it compatible with many commercially available devices, i.e., it is supported natively without requiring additional interfaces for its installation.

Modern touchscreens also allow the user to interact directly with the device on which they are mounted without using additional apparatuses such as a mouse or a touchpad. The spread of this type of screen is due to the fact that they allow intuitive, fast and accurate user interaction with the content shown on the screen. In any case, differently from traditional electromechanical interfaces of the M22 type, the touchscreen is often installed on dedicated devices such as smartphones according to methods that are not standard.

The background art lacks a system capable of combining the sturdiness and compatibility of interfaces based on M22 technology with the benefits deriving from the use of a touchscreen.

Within this aim, the disclosure provides a system that can be adapted and used in different contests.

SUMMARY

The disclosure provides a system that is functional and efficient.

The disclosure provides a system that is sturdy and gives assurances of safety.

Advantageously, the system requires the use of materials that are easily commercially available.

Conveniently, the system can be integrated in existing devices.

Preferably, the system allows simpler installation and quicker maintenance.

Conveniently, the system is not constrained to the use of a particular communications standard.

BRIEF DESCRIPTION OF THE DRAWINGS

Further characteristics and advantages of the disclosure will become better apparent from the following detailed description, given by way of non-limiting example and accompanied by the corresponding drawings. In the drawings.

DETAILED DESCRIPTION OF THE DRAWINGS

Figure 1:
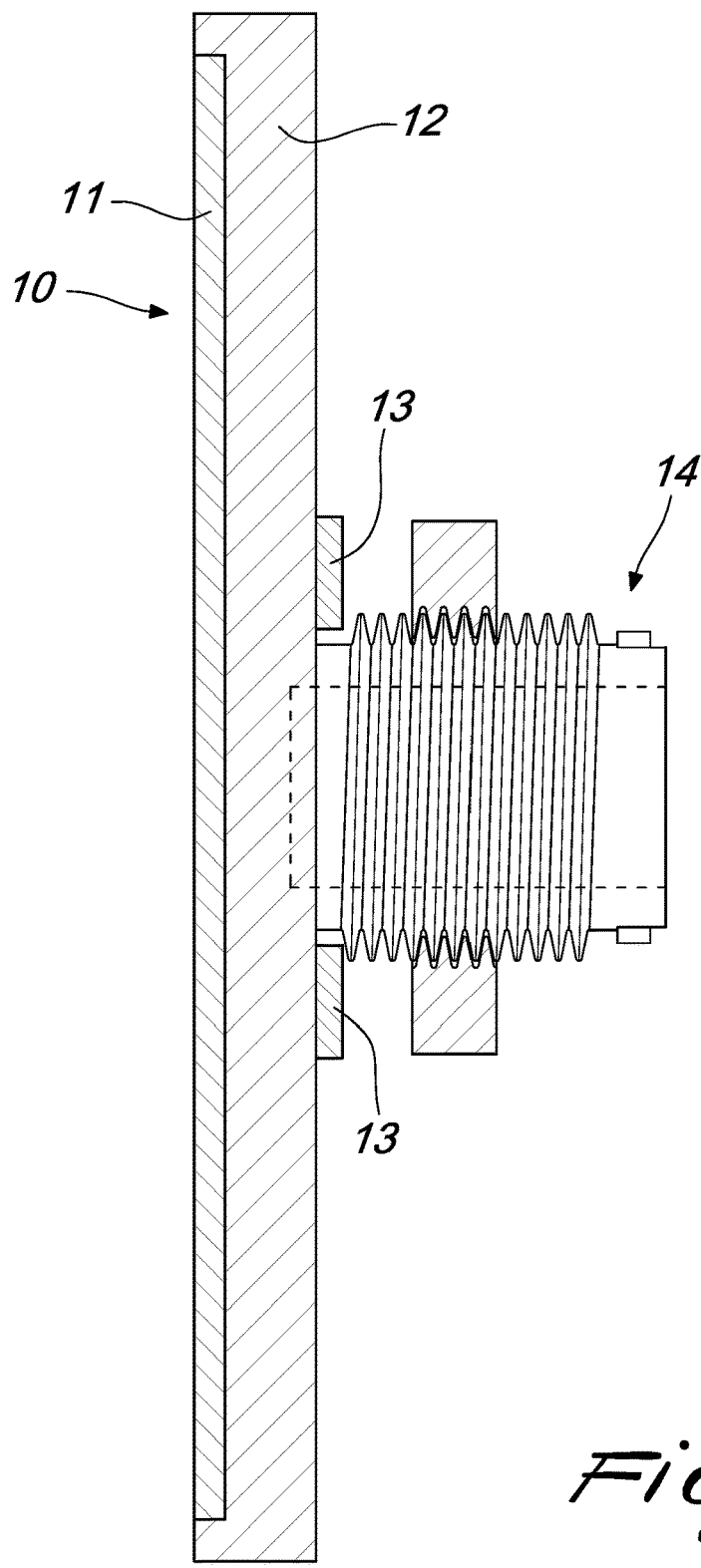
FIG. 1 is a block diagram of the system according to the present disclosure.

An exemplifying architecture of the system according to the present disclosure is summarized in the block diagram of FIG. 1.

FIG. 1 comprises a monitor 10 and a cylindrical body 14.

The monitor 10 comprises a liquid crystal display ("LCD") 11 and a panel 12 adapted to contain it. The monitor 10 has a depth of preferably not more than 18 mm and is adapted to be inserted for example in industrial panels, preferably with a depth of no more than 15 mm, in recesses in walls, in wall-mounted containers for electrical material, known as wall boxes, or in machinery. Furthermore, the monitor 10 may comprise circuitry adapted to process and exchange data.

The screen 11 is of a known type and comprises an optical electronic device adapted to reproduce images. The screen 11 is flat, of the touchscreen type, preferably of the capacitive type, that allows a user to react to what is displayed, for example in order to control the display mode or to enter data. The screen 11 is based on liquid crystal technology, preferably of the TFT type or OLED type.

The screen 11 has preferably dimensions equal to 5 or 7 inches with a resolution of 800×480 pixels. The screen 11 can have also smaller dimensions, equal to 3.5 inches with low resolution, or greater, equal to 10.2 or 15 inches, and a resolution equal to 1280×800 pixels. The screen 11 preferably has maximum dimensions equal to 23 inches.

Preferably, the screen does not use plastic material and is mounted on the panel 12.

The panel 12, in addition to being the support for the screen 11, has, on the side opposite to the one on which the screen 11 is mounted, an interface, preferably arranged in a central position of the panel proper, which is adapted to receive the cylindrical body 14 that will be presented hereinafter. Preferably, this interface comprises a circular cavity with a diameter equal to 22 mm.

In addition, the panel 12 has gaskets 13 adapted to make the installation of the cylindrical body 14 safer and more stable.

The cylindrical body 14 comprises an enclosure, preferably made of aluminum and obtained by means of the pressure die-casting technique, that has an end face adapted to be accommodated inside the cavity of the panel 12 and a second end face adapted to accommodate a device for the transmission of data. The lateral surface of the enclosure of the cylindrical body has, moreover, a thread that allows a helical coupling. The thread can take the appearance of a groove with a helical shape, cut into the cylindrical surface of the body 14, while the longitudinal cross-section usually has an approximately triangular shape, with an alternation of external peaks and internal peaks. The thread allows to apply a locking ring that allows the flush assembly, for example by screwing, of the monitor 10 on a recess, such as a wall, and industrial cabinet or a domestic device. The constructive characteristics of the cylindrical body 14 are such as to make it equivalent to an M22 connector and therefore the diameter of its circular cross-section is 22 mm or substantially equal to 22 mm. Consequently, the system of FIG. 1 can be installed on all apparatuses that are compatible or that in any case have interfaces that allow to fix it.

The device for the transmission of data is preferably an Ethernet RJ-45—ISO8877 10-100 cable with Power over Ethernet (PoE) functionality according to the POE 802.3af/at standard. The POE standard allows the simultaneous transmission of energy and data using an Ethernet cable. The Ethernet cable has a maximum diameter of 18.4 mm, so that it can be inserted easily inside the cylindrical body 14.

The cable supplies power to the screen 11 and allows the exchange of data with it. The Ethernet cable is therefore connected to the screen on one side of the transmission and on the other side is connected to a unit adapted to supply and receive data from it. For example, this unit might be an industrial machine and the monitor 10 might be used as an interface for controlling one aspect of this machine, for example as a knob for opening a valve. In this case, the monitor shows an icon that represent a virtual knob. By way of the functionalities of the touchscreen, the operator can stimulate the screen so as to simulate the rotation of the knob. The command, conveniently encoded by suitable circuitry, is transmitted by means of the electronic device in order to be then received and processed by the machine Accordingly, the valve is opened. The machine may send a confirmation of actual opening by transmitting a data item on the electronic device toward the screen 11. The screen 11 shows conveniently such confirmation for example by means of a luminous signal.

Figure 2A:
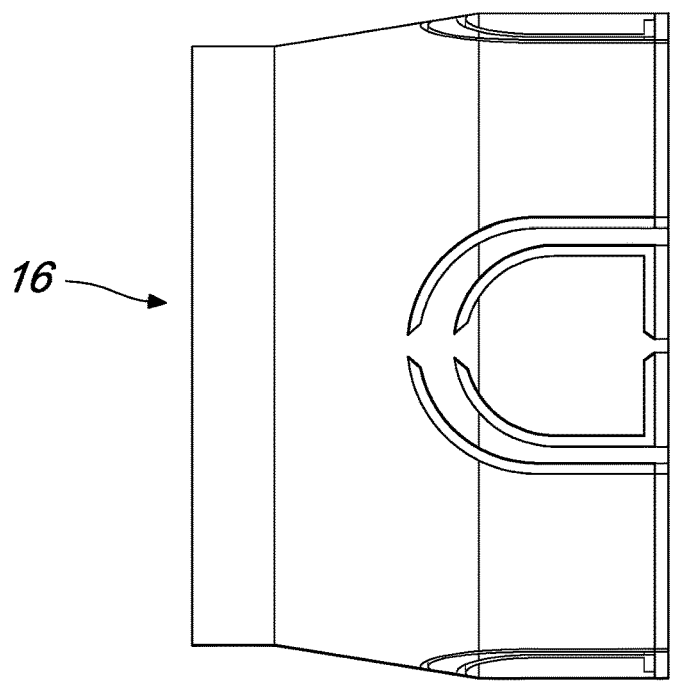
FIGS. 2a and 2b are views of an aspect of the system of FIG. 1.
Figure 2B:
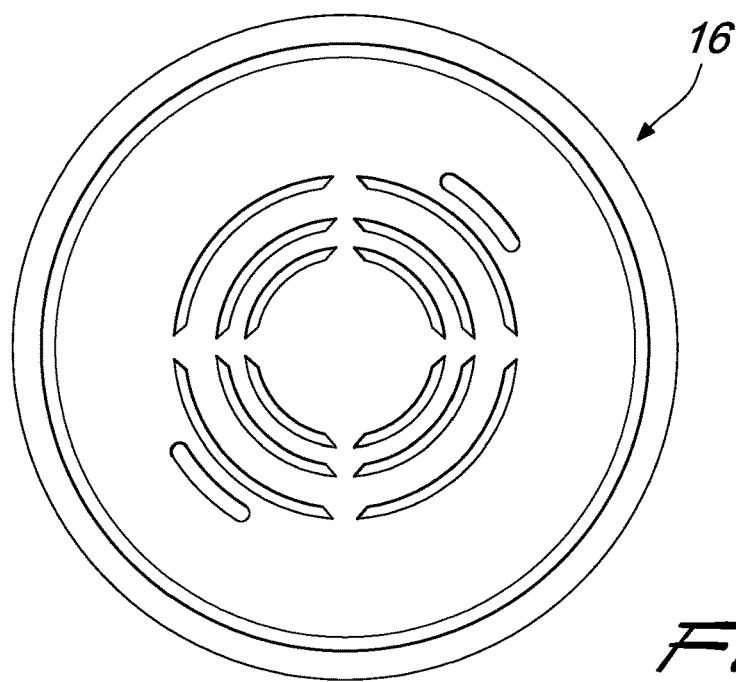

FIGS. 2a, 2b illustrate an adapter to allow the installation of the system of FIG. 1 on containers for electrical cables built into walls, usually termed wall boxes. In fact, such wall boxes are not provided natively with a support for the M22 connectors and therefore an adapter that allows the screwing of the cylindrical body 14 is necessary.

In particular, FIGS. 2a and 2b show respectively a lateral and front section of said adapter 16. The adapter 16 has dimensions adapted to receive the cylindrical body 14. In a preferred embodiment, it has a diameter of no more than 60 mm and a length comprised between 49 mm and 50 mm. The adapter 16 allows the passage of the electronic device for the transmission of data and the screwing of the cylindrical body 14.

Figure 3:
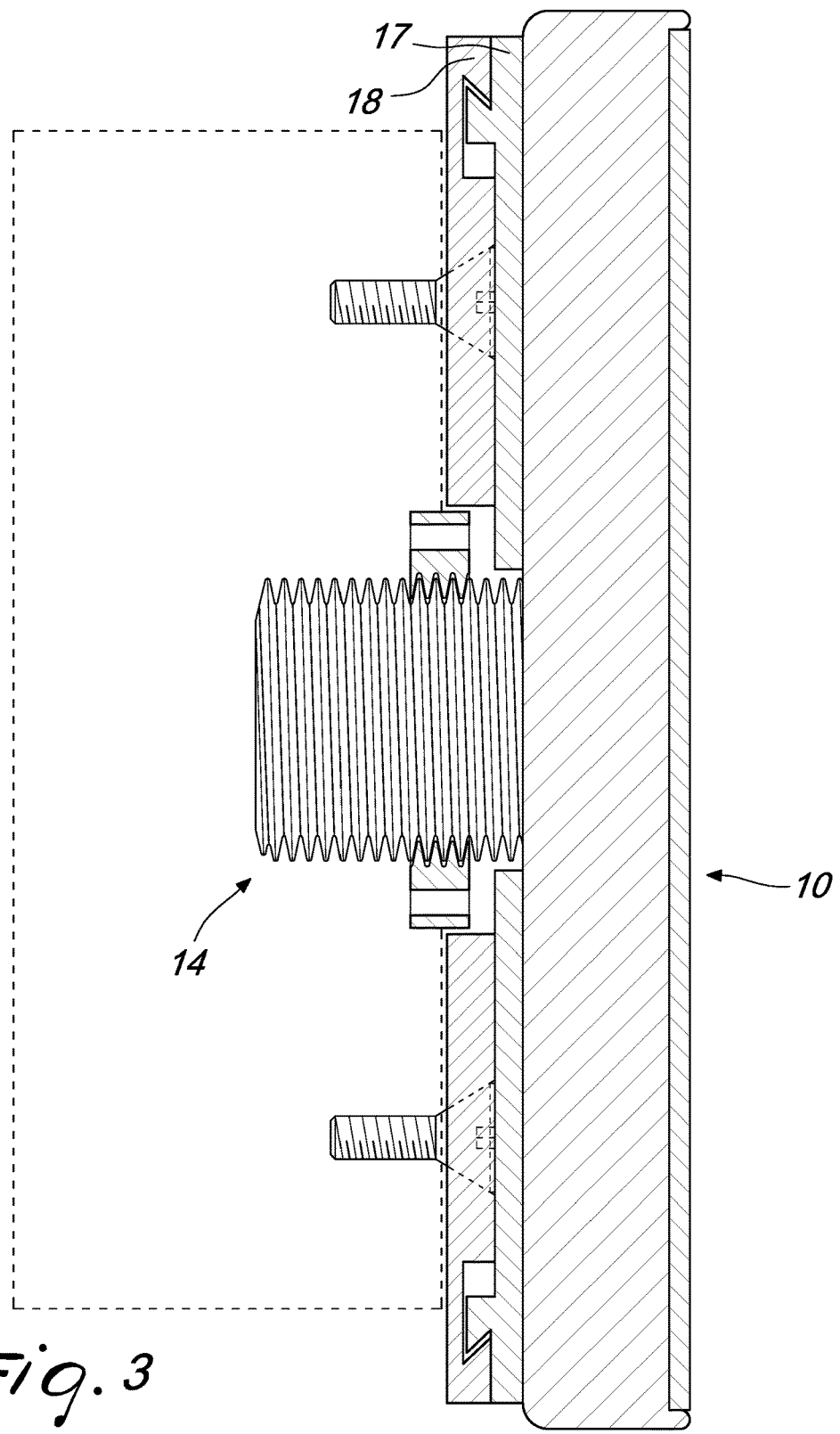
FIG. 3 is a view of an embodiment of the system of FIG. 1.

FIG. 3 shows the system of FIG. 1, which is further adapted to be used in conjunction with the adapter of FIGS. 2a and 2b. In particular, the panel 12 comprises a fixing device based on elastic coupling, which has springs or flexing elastic parts 17 adapted to be interlocked on a flush adapter 18 that is fixed by way of screws to the wall box.

Figure 4:
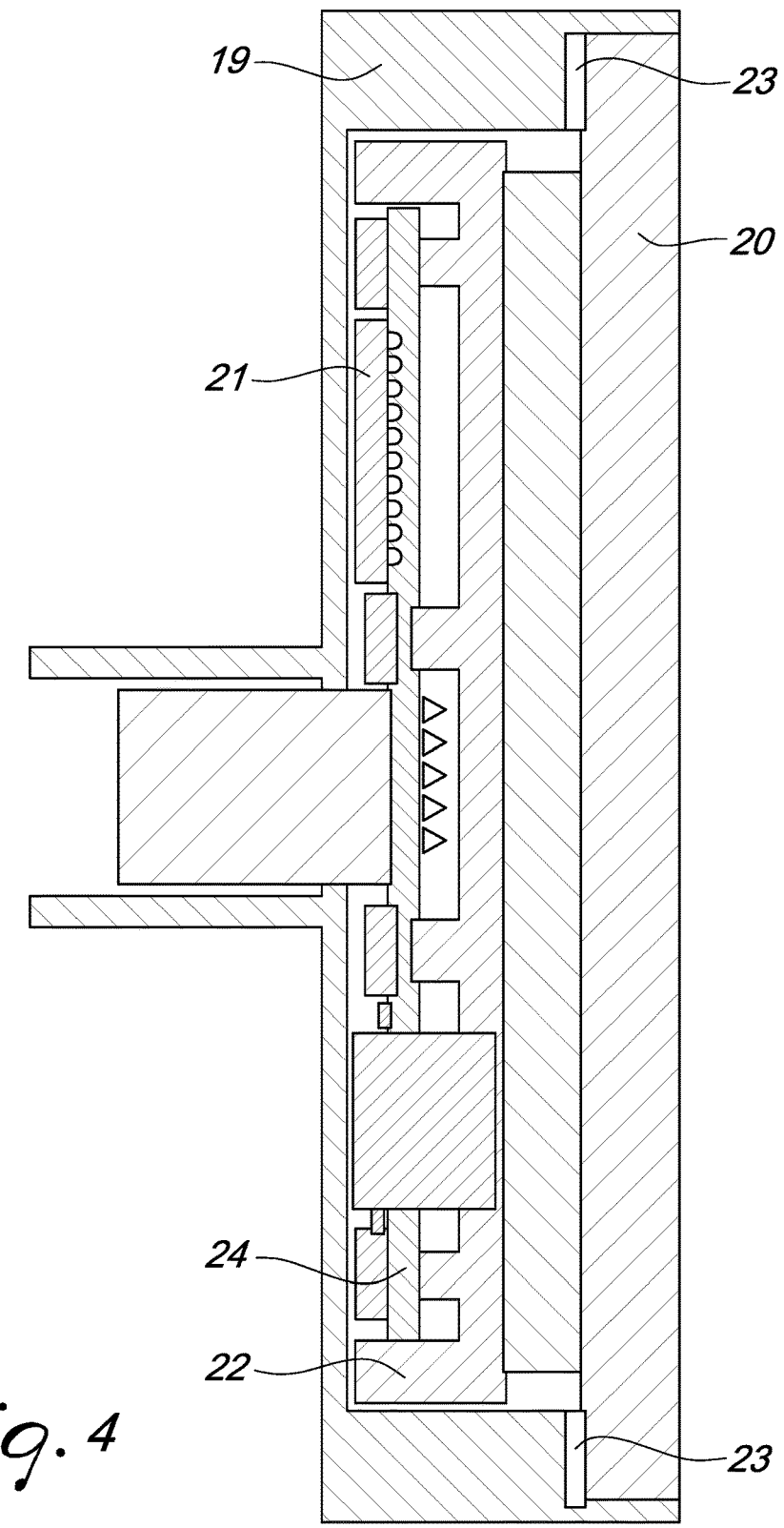
FIG. 4 is a more detailed view of a further aspect of the system of FIG. 1.

FIG. 4 shows in greater detail the system of FIG. 1, further adapted to be used in industrial contexts, in which intense vibrations, extreme temperatures and humid or dusty conditions might damage the monitor 10.

In particular, the system comprises moreover an enclosure 19, a second screen 20, a heat sink 21, a plastic frame 22 and gaskets 23.

The enclosure 19 is adapted to shield electromagnetic interferences and has such dimensions as to allow to contain both the data transmission device and the monitor 10. The enclosure 19 is preferably made of aluminum and is reinforced so as to withstand mechanical stresses.

The second screen 20 is based on PCAP capacitive technology and is adapted to protect the screen 11 from excessive pressures or external agents.

The heat sink 21 protects the system from temperature variations.

The plastic frame 22 is provided so as to reinforce the area comprised between the screen 11 and the circuitry 24 connected to the monitor, so as to protect the screen and the circuitry proper from any bending.

Moreover, gaskets 23 are provided, preferably arranged between the screen 20 and the enclosure 19, in order to provide an "Internal Protection" rating equal to IP69K.

In practice it has been found that the described method and system achieve the intended aim. In particular, it has been shown that the system thus conceived allows to overcome the quality limits of the background art.

Clearly, numerous modifications are evident and can be promptly performed by the person skilled in the art without abandoning the scope of protection of the present disclosure.

For example, although in the present description the electronic device for the transmission of data has been presented mainly as an Ethernet cable, it can comprise an adaptor adapted to receive a plurality of Ethernet cables or cables adapted to supply additional power or an assembling system based on a DIN rail. Moreover, the electronic device can also comprise an interface that supports WiFi or Bluetooth.

Since the system can be supplied in different contexts, it can have different degrees of IP protection. For example, the system in FIG. 1 might have an IP67 protection rating on the side where the cylindrical body 14 is present and a protection rating equal to IP69K on the side that faces the screen 11.

The system of FIG. 1 can be applied also in domestic environments, for example in controlling windows and doors. In this case it might be inserted in a suitable cavity of a wall adapted to receive it, known as a socket box.

The system according to the present disclosure can be further adapted, by means of a convenient choice of materials and of the configuration of the elements that compose it, so as to limit its production costs. For example, the screen 11 can be of the resistive type, the enclosure of the cylindrical body 14 can be provided by using plastic material, can be of the multicore type and can contain circuitry for power supply and interfaces for connections of the serial, CAN bus and Ethernet type.

The invention claimed is:

1. A system for controlling industrial and domestic devices, comprising a monitor and a cylindrical body, wherein:

said monitor comprises a liquid crystal display multitouch screen adapted for optical display and for data entry by a user, a panel that supports said multitouch screen and that has an interface adapted to receive said cylindrical body and circuitry adapted to process and exchange data;

said cylindrical body further having a cavity adapted to contain a data receiving device, said cylindrical body being further adapted to be fixed to said industrial and domestic devices; and said cylindrical body being fixed in a hole measuring 22 mm provided in said panel of said monitor, and said data receiving device being constituted by exactly one Ethernet cable providing simultaneous energy and data transmission to said multitouch screen, said Ethernet cable being arranged inside said cavity of said cylindrical body;

said system further comprising:

an enclosure adapted to shield electromagnetic interferences and adapted to contain said cylindrical body and said monitor;

a second screen based on capacitive technology, which is arranged on said multitouch screen and is connected to said enclosure adapted to shield electromagnetic interferences and having gaskets with an IP69 K protection level;

a heat sink;

a frame adapted to support said screen and electronic circuitry of said monitor.

2. The system according to claim 1, wherein said CAT5RJ-45 Ethernet cable has a maximum diameter of 18.4 mm and wherein said screen is powered by said CAT5 RJ-45 Ethernet cable according to a POE 802.3af/at protocol.

3. The system according to claim 1, wherein said screen has dimensions equal to 3.5 inches, 5 inches, 7 inches, 10.2 inches, and 15 inches.

4. The system according to claim 1, further comprising a mechanism that is adapted to fix said panel to a resting surface, such as a wall or an industrial panel.

5. The system according to claim 1, wherein said cylindrical body comprises a cylindrical enclosure, said enclosure having a thread on a lateral surface, the thread being adapted to be screwed onto a locking ring, and wherein said panel further comprises at least two sealing gaskets arranged at the ends of said interface that is adapted to receive said cylindrical body.

6. The system according to claim 1, wherein the depth of said monitor is at the most 18 mm.

7. The system according to claim 1, further comprising a fixing device that is based on an elastic coupling that comprises springs or flexing elastic parts adapted to be interlocked on a flush adapter that is fixed by means of screws to a wall box.

\* \* \* \* \*